United States Patent
Leewis et al.

(10) Patent No.: US 9,436,099 B2
(45) Date of Patent: Sep. 6, 2016

(54) LITHOGRAPHIC FOCUS AND DOSE MEASUREMENT USING A 2-D TARGET

(71) Applicant: ASML Netherlands B.V., Veldhoven (NL)

(72) Inventors: Christian Marinus Leewis, Maastricht (NL); Hugo Augustinus Joseph Cramer, Eindhoven (NL); Marcus Adrianus Van De Kerkhof, Helmond (NL); Johannes Anna Quaedackers, Veldhoven (NL); Christine Corinne Mattheus, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/273,707

(22) Filed: May 9, 2014

(65) Prior Publication Data
US 2014/0247434 A1 Sep. 4, 2014

Related U.S. Application Data

(62) Division of application No. 13/062,861, filed as application No. PCT/EP2009/062840 on Oct. 2, 2009, now Pat. No. 8,891,061.

(60) Provisional application No. 61/103,078, filed on Oct. 6, 2008.

(51) Int. Cl.
*G03B 27/32* (2006.01)
*G03B 27/52* (2006.01)
(Continued)

(52) U.S. Cl.
CPC .............. *G03F 7/70641* (2013.01); *G03F 1/38* (2013.01); *G03F 7/706* (2013.01); *G03F 7/70608* (2013.01); *G03F 7/70625* (2013.01); *G03F 7/70675* (2013.01); *G03F 7/70683* (2013.01)

(58) Field of Classification Search
CPC ............ G03F 1/16–1/48; G03F 7/706; G03F 7/70608; G03F 7/70625; G03F 7/70641; G03F 7/70675; G03F 7/70683; G03F 9/7019; G03F 9/7023; G03F 9/7026; G03F 9/7046; G03F 9/7076
USPC ....... 250/252.1, 393; 355/27, 53, 55, 67, 71, 355/77; 356/624; 430/5, 30, 311
See application file for complete search history.

(56) References Cited

U.S. PATENT DOCUMENTS

| | | |
|---|---|---|
| 5,300,786 A | 4/1994 | Brunner et al. |
| 5,989,756 A | 11/1999 | Nakae |

(Continued)

FOREIGN PATENT DOCUMENTS

| | | |
|---|---|---|
| EP | 1 628 164 A2 | 2/2006 |
| JP | 06-204305 A | 7/1994 |

(Continued)

OTHER PUBLICATIONS

International Search Report directed to related International Patent Application No. PCT/EP2009/062840, mailed Jan. 4, 2010, European Patent Office, Rijswijk, Netherlands; 3 pages.

(Continued)

*Primary Examiner* — Colin Kreutzer
(74) *Attorney, Agent, or Firm* — Sterne, Kessler, Goldstein & Fox P.L.L.C.

(57) ABSTRACT

In order to determine whether an exposure apparatus is outputting the correct dose of radiation and its projection system is focusing the radiation correctly, a test pattern is used on a mask for printing a specific marker onto a substrate. This marker is then measured by an inspection apparatus, such as a scatterometer, to determine whether there are errors in focus and dose and other related properties. The test pattern is configured such that changes in focus and dose may be easily determined by measuring the properties of a pattern that is exposed using the mask. The test pattern may be a 2D pattern where physical or geometric properties, e.g., pitch, are different in each of the two dimensions. The test pattern may also be a one-dimensional pattern made up of an array of structures in one dimension, the structures being made up of at least one substructure, the substructures reacting differently to focus and dose and giving rise to an exposed pattern from which focus and dose may be determined.

11 Claims, 10 Drawing Sheets

(51) Int. Cl.
*G03C 5/00* (2006.01)
*G03F 7/00* (2006.01)
*G03F 7/20* (2006.01)
*G03F 1/38* (2012.01)

(56) References Cited

U.S. PATENT DOCUMENTS

| | | | |
|---|---|---|---|
| 6,130,016 | A | 10/2000 | Kent |
| 6,376,139 | B1 | 4/2002 | Fujisawa et al. |
| 7,250,235 | B2 | 7/2007 | Izuha et al. |
| 7,369,224 | B2 | 5/2008 | Oomori et al. |
| 7,656,512 | B2 | 2/2010 | Mieher et al. |
| 7,732,103 | B2 | 6/2010 | Yao |
| 2002/0055048 | A1 | 5/2002 | Ueno |
| 2002/0097399 | A1 | 7/2002 | Ausschnitt et al. |
| 2004/0190008 | A1* | 9/2004 | Mieher et al. ............... 356/625 |
| 2007/0054198 | A1 | 3/2007 | Park |
| 2008/0088832 | A1 | 4/2008 | Cramer et al. |
| 2011/0249244 | A1 | 10/2011 | Leewis et al. |

FOREIGN PATENT DOCUMENTS

| | | |
|---|---|---|
| JP | 11-109603 A | 4/1999 |
| JP | 11-162841 A | 6/1999 |
| JP | 2001-102282 A | 4/2001 |
| JP | 2004-259765 A | 9/2004 |
| JP | 2005-513757 A | 5/2005 |
| JP | 2006-135211 A | 5/2006 |
| JP | 2007-081292 A | 3/2007 |
| JP | 2008-026656 A | 2/2008 |
| JP | 2008-053413 A | 3/2008 |
| WO | WO 2009/107143 A2 | 9/2009 |

OTHER PUBLICATIONS

International Preliminary Report on Patentability and Written Opinion of the International Searching Authority directed to related International Patent Application No. PCT/EP2009/062840, issued Apr. 12, 2011, the International Bureau of WIPO, Geneva, Switzerland; 8 pages.

English-Language Abstract for Japanese Patent Publication No. 11-162841 A, published Jun. 18, 1999; 1 page.

English-Language Abstract for Japanese Patent Publication No. 2007-081292 A, published Mar. 29, 2007; 1 page.

English-Language Abstract for Japanese Patent Publication No. 2008-053413 A, published Mar. 6, 2008; 1 page.

Non-Final Rejection mailed Nov. 22, 2013 for U.S. Appl. No. 13/062,861, filed Jun. 13, 2011; 14 pages.

Final Rejection mailed Mar. 12, 2014 for U.S. Appl. No. 13/062,861, filed Jun. 13, 2011; 11 pages.

Notice of Allowance mailed May 28, 2014 for U.S. Appl. No. 13/062,861, filed Jun. 13, 2011; 8 pages.

Notice of Allowance mailed Jul. 3, 2014 for U.S. Appl. No, 13/062,861, filed Jun. 13, 2011; 9 pages.

* cited by examiner

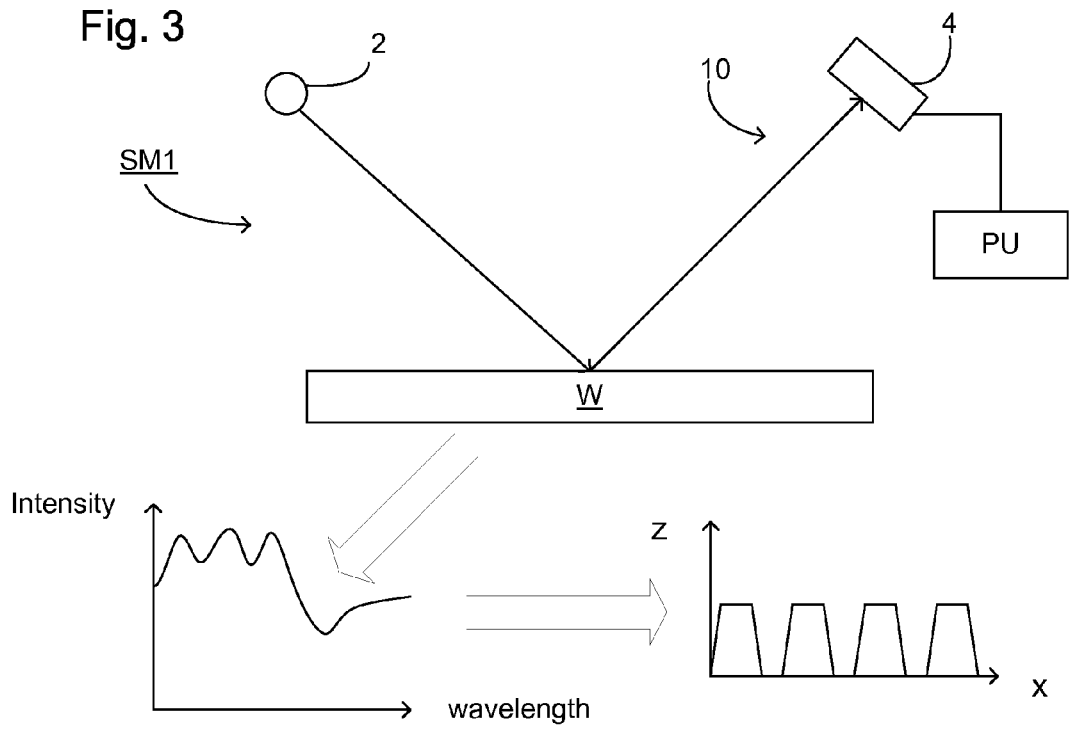
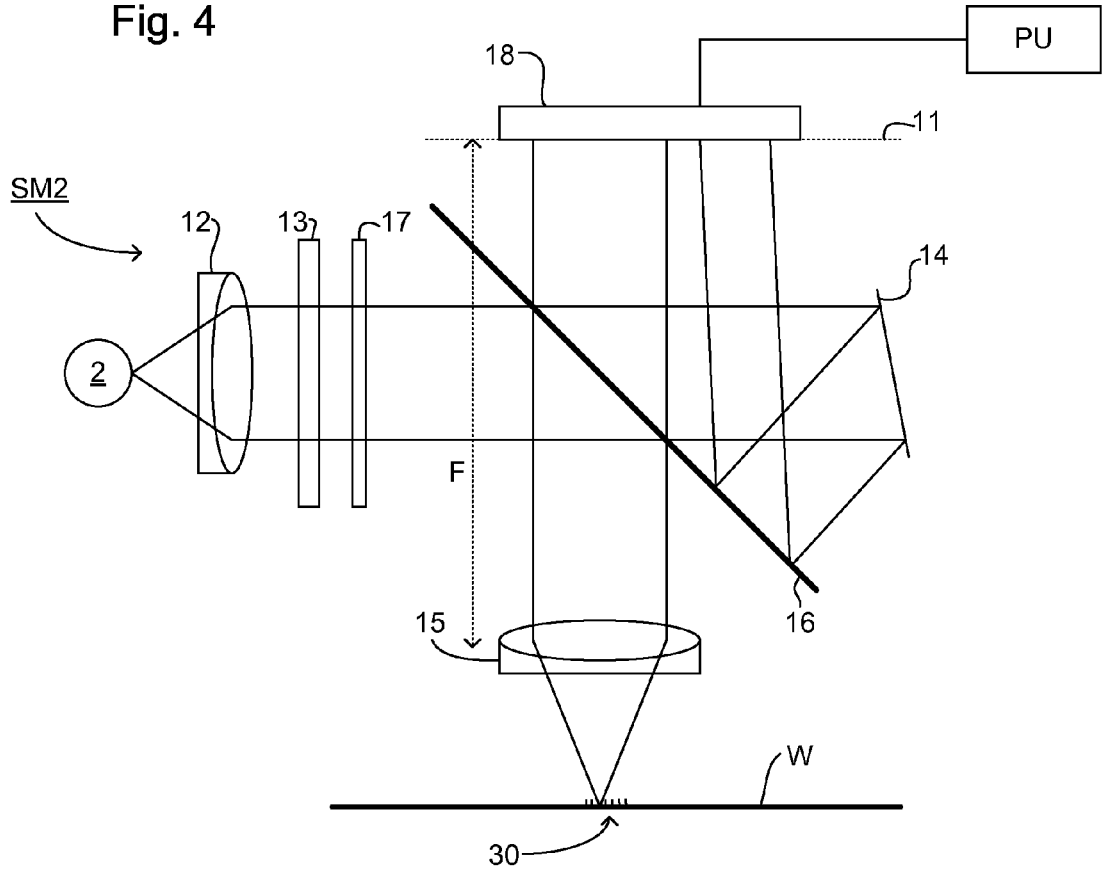

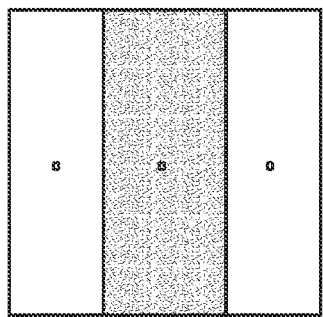
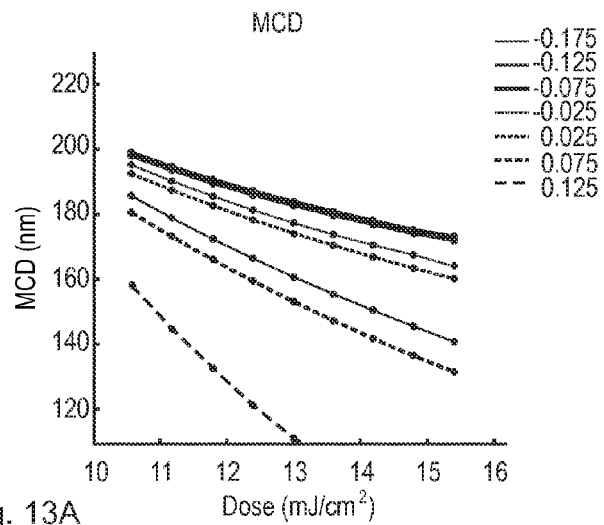
Fig. 13A
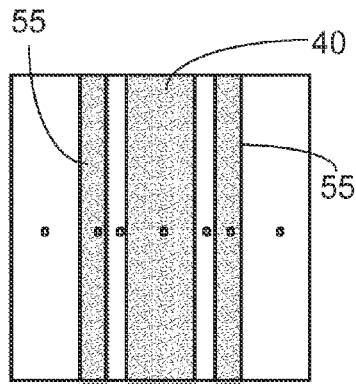
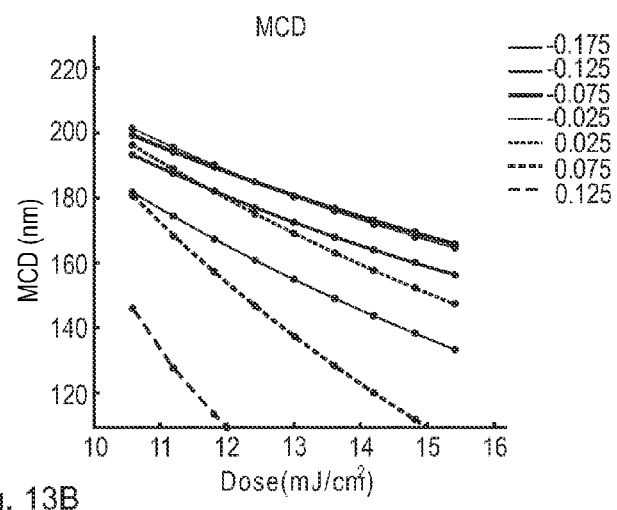
Fig. 13B
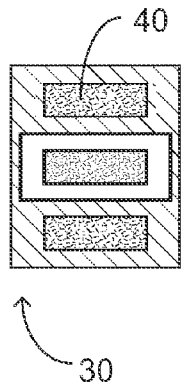
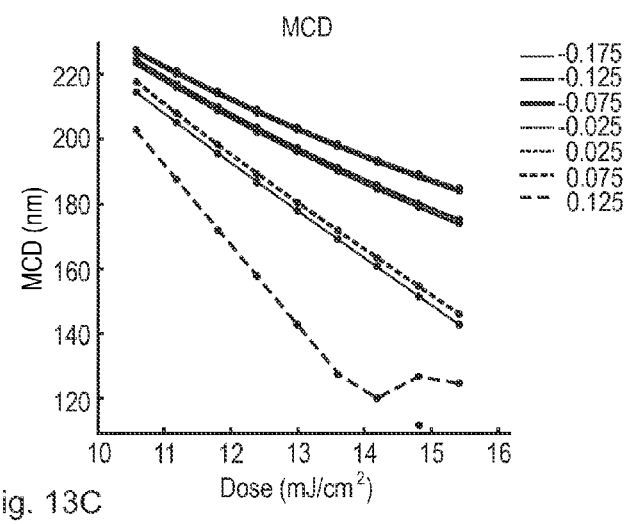
Fig. 13C

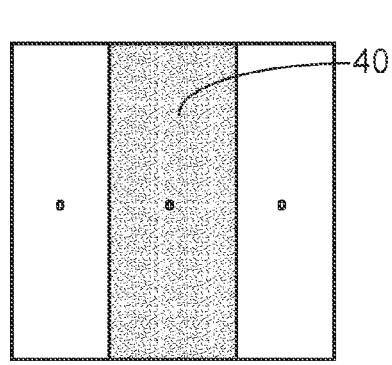
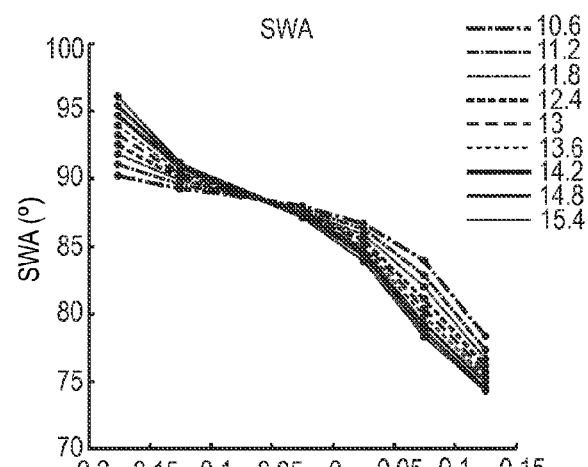
Fig. 15A
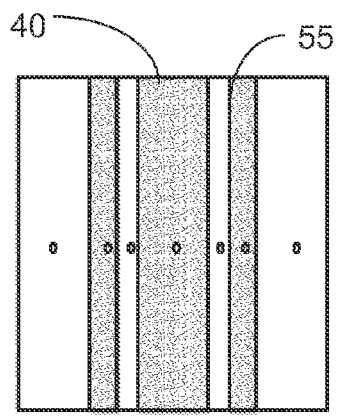
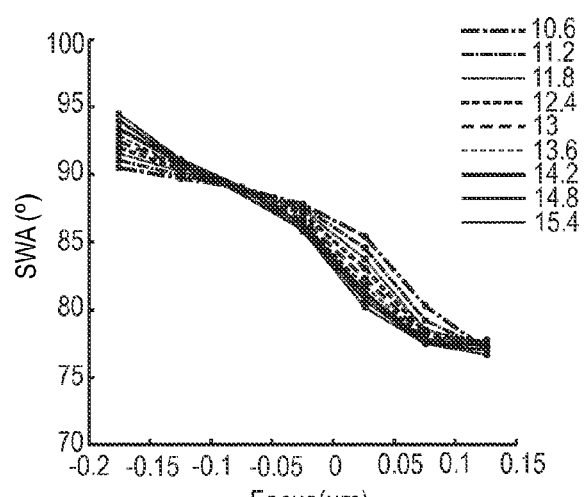
Fig. 15B
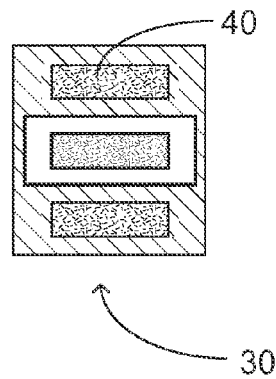
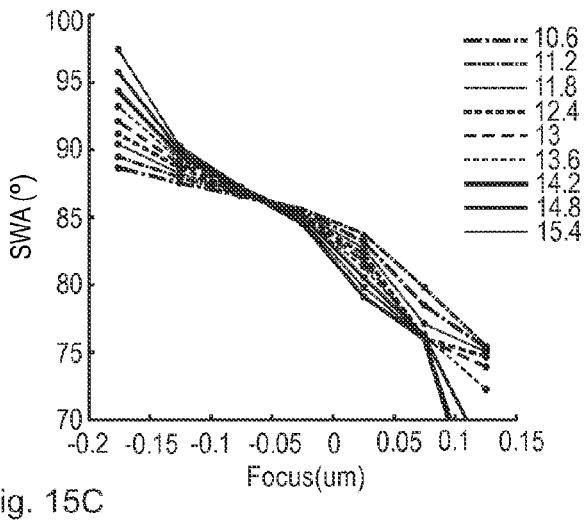
Fig. 15C

| | Dose sensitivity [nm/(mJ/cm$^2$)] | Focus sensitivity [°/um] |
|---|---|---|
| No assist features | 5.2 | 23 |
| Assist features | 6.7 | 34 |
| 2D | 9.3 | 36 |

LITHOGRAPHIC FOCUS AND DOSE MEASUREMENT USING A 2-D TARGET

This application incorporates by reference in their entireties U.S. patent application Ser. No. 13/062,861, filed Jun. 13, 2011 and U.S. provisional application 61/103,078, filed Oct. 6, 2008.

FIELD OF THE INVENTION

The present invention relates to methods of inspection usable, for example, in the manufacture of devices by lithographic techniques. Specifically, the present invention relates to a pattern for printing a marker on a substrate for testing focus and dose related properties of a lithographic apparatus. The invention relates also to the mask containing the pattern, to the substrate containing the marker, to the exposure apparatus that prints the marker, to the inspection apparatus that tests the marker and to the methods involved.

RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (e.g., intensity as a function of wavelength) of the radiation scattered into a particular narrow angular range. Angularly resolved scatterometers use a monochromatic radiation beam and measure the intensity of the scattered radiation as a function of angle.

Scatterometers may be used to measure several different aspects of lithographic apparatuses, including their substrate orientation and exposure efficacy. Two important parameters of a lithographic apparatus and specifically of the exposure action that the lithographic apparatus carries out that may also be measured by scatterometers are focus and dose. Specifically, a lithographic apparatus has a radiation source and a projection system as mentioned below. The dose of radiation that is projected onto a substrate in order to expose it is controlled by various parts of the exposure or lithographic apparatus. It is mostly the projection system of the lithographic apparatus that is responsible for the focus of the radiation onto the correct portions of the substrate. It is important that the focusing occurs at the level of the substrate, rather than before or afterwards so that the sharpest image will occur at the level of the substrate and the sharpest pattern possible may be exposed thereon. This enables smaller product patterns to be printed.

The focus and dose of the radiation directly affect the parameters of the patterns or structures that are exposed on the substrate. Parameters that can be measured using a scatterometer are physical properties of structures that have been printed onto a substrate such as the critical dimension (CD) or sidewall angle (SWA) of, for example, a bar-shaped structure. The critical dimension is effectively the mean width of a structure, for example, such as a bar, space, dot or hole, depending on the measured structures. The sidewall angle is the angle between the surface of the substrate and the rising or falling, portion of the structure.

In addition, mask shape corrections, for example, such as focus corrections for correcting for the bending of a mask, can be applied if scribe lane structures are used with a product mask for focus measurements.

Focus and dose have been determined simultaneously by scatterometry, or scanning electron microscopy, from one-dimensional structures in the mask pattern, which gives rise to one-dimensional markers on the substrate, from which measurements are taken. A single structure can be used as long as that structure, when exposed and processed, has a unique combination of critical dimension and sidewall angle measurements for each point in a focus energy matrix (FEM). If these unique combinations of critical dimension and sidewall angle are available, the focus and dose values can be uniquely determined from these measurements.

However, there is a problem with this use of one-dimensional structures. There are generally a plurality of combinations of focus and dose that result in similar critical dimension and sidewall angle measurements. This means that focus and dose cannot be determined uniquely by measuring a single one-dimensional structure. It has been considered to use more than one structure in separate adjacent markers to resolve this ambiguity. However, having a plurality of markers incorporating different structures has disadvantages that the area of the substrate used for measurement markers and the measurement time for measuring all the different measurement markers increase proportionally with a number of structures and may increase proportionally with the decrease in ambiguity.

SUMMARY

Therefore, what is needed is an effective system and method capable of measuring focus and dose of an exposure apparatus while minimizing the surface area of a mask, and thereby of a substrate, used in the process.

In an embodiment of the present invention, there is provided a method of measuring focus and/or dose related properties of an exposure apparatus, the method comprising printing a marker on a substrate using the exposure apparatus to be measured and a mask including a pattern for creating the marker, the pattern comprising an array of structures, the array having a pitch in one direction that is resolvable by the exposure apparatus and a pitch in a second direction different from the first direction that is not resolvable by the exposure apparatus. The method continues by measuring a property of the substrate that has been exposed by the exposure apparatus using the mask, comprising projecting a radiation beam onto the marker on the substrate and detecting radiation reflected from the marker on the substrate, and determining, from the properties of the reflected radiation, the focus and/or dose related properties of the exposure apparatus.

In another embodiment of the present invention, there is provided a mask for use in an exposure apparatus, the mask comprising a pattern for printing a marker on a substrate, the pattern comprising an array of structures, the array having a first pitch in one direction that is resolvable by the exposure apparatus and a second pitch in a second direction different from the first direction that is not resolvable by the exposure apparatus.

In a further embodiment of the present invention, there is provided a projection apparatus for use in an exposure apparatus configured to print a marker on a substrate using a mask that contains a pattern for printing the marker, the projection apparatus being configured to resolve the pattern on the mask in a first direction and not to resolve the pattern in a second direction that is different from the first direction.

In yet another embodiment of the present invention, there is provided a substrate comprising a marker, the marker having been printed using a pattern that comprises an array of structures, the array having a pitch in one direction that is resolved in the marker and a pitch in a second direction different from the first direction that is not resolved in the marker.

In a still further embodiment of the present invention, there is provided an inspection system for measuring focus and/or dose related properties of an exposure apparatus, the inspection system comprising a mask including a pattern for printing a marker on a substrate using the exposure apparatus to be measured, the pattern comprising an array of structures, the array having a pitch in one direction that is resolvable by the exposure apparatus to be measured and a pitch in a second direction different from the first direction that is not resolvable by the exposure apparatus to be measured. The system also includes an inspection apparatus configured to measure a property of a substrate on which a marker has been printed by the exposure apparatus using the mask, comprising a radiation source, a projection system configured to direct radiation from the radiation source onto the marker, a detector configured to detect radiation reflected from the marker, and a processor configured to determine, from the properties of the reflected radiation, the focus and/or dose related properties of the exposure apparatus.

In further embodiments of the present invention, there are provided a lithographic apparatus, a lithographic cell and an inspection apparatus configured to measure a property of a substrate on which a marker has been printed by an exposure apparatus using a mask containing a pattern, the marker having been printed using a pattern that comprises an array of structures, the array having a pitch in one direction that is resolved in the marker and a pitch in a second direction different from the first direction that is not resolved in the marker, the inspection apparatus comprising a radiation source, a projection system configured to direct radiation from the radiation source onto the marker, a detector configured to detect radiation reflected from the marker; and a processor configured to determine properties of the market comprised from the detected radiation, the properties of the reflected radiation, the focus, and the dose related properties of the exposure apparatus.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example only, with reference to the accompanying drawings in which corresponding reference symbols indicate corresponding parts. Further, the accompanying drawings, which are incorporated herein and form part of the specification, illustrate the present invention and, together with the description, further serve to explain the principles of the invention and to enable a person skilled in the relevant art(s) to make and use the invention.

FIG. 3 depicts a first scatterometer according to an embodiment of the invention;

FIG. 4 depicts a second scatterometer according to an embodiment of the invention;

Figure 14:
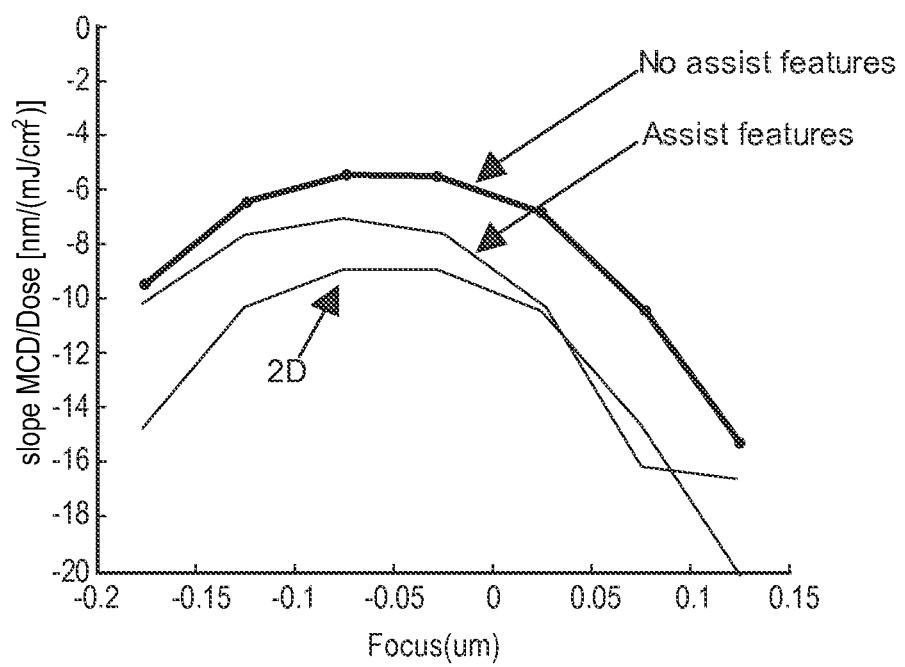
Figures 16, 17:
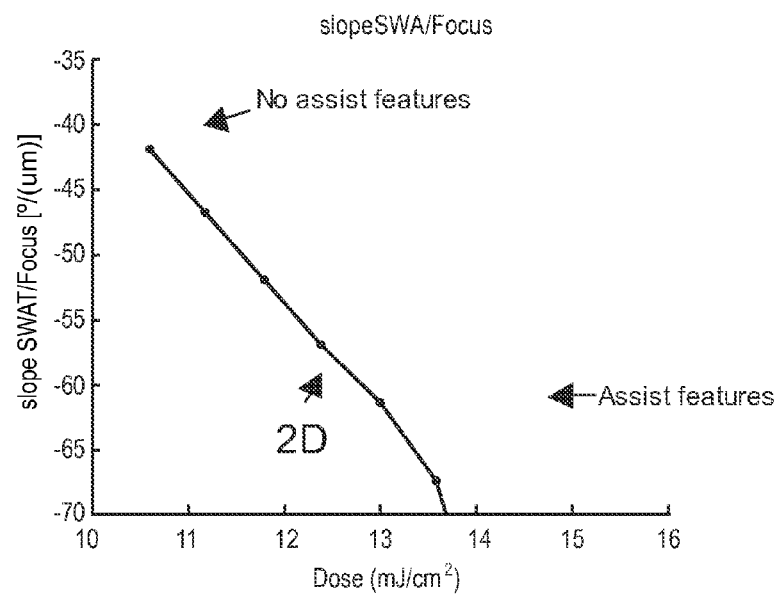

FIGS. 13A, 13B and 13C compare dose measurements using different patterns according to an embodiment of the invention;

FIG. 14 depicts the relationship between critical dimension, dose and focus for different patterns according to an embodiment of the invention;

FIGS. 15A, 15B and 15C depict relationships between sidewall angle and focus for different patterns according to an embodiment of the invention;

FIG. 16 depicts the relationship between sidewall angle, focus and dose for each of the different patterns of FIG. 15, according to an embodiment of the invention; and FIG. 17 is a table comparing dose and focus sensitivity for three different patterns, according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
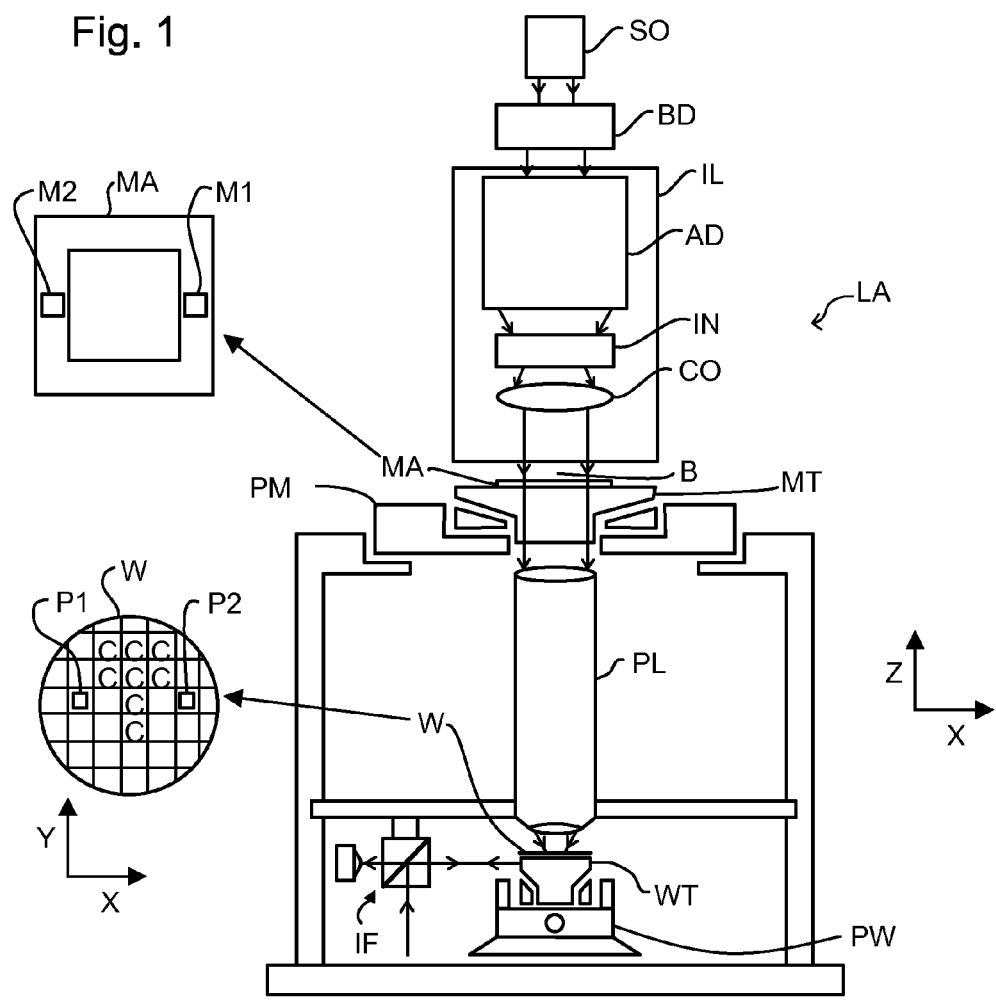
FIG. 1 depicts a lithographic apparatus according to an embodiment of the invention.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
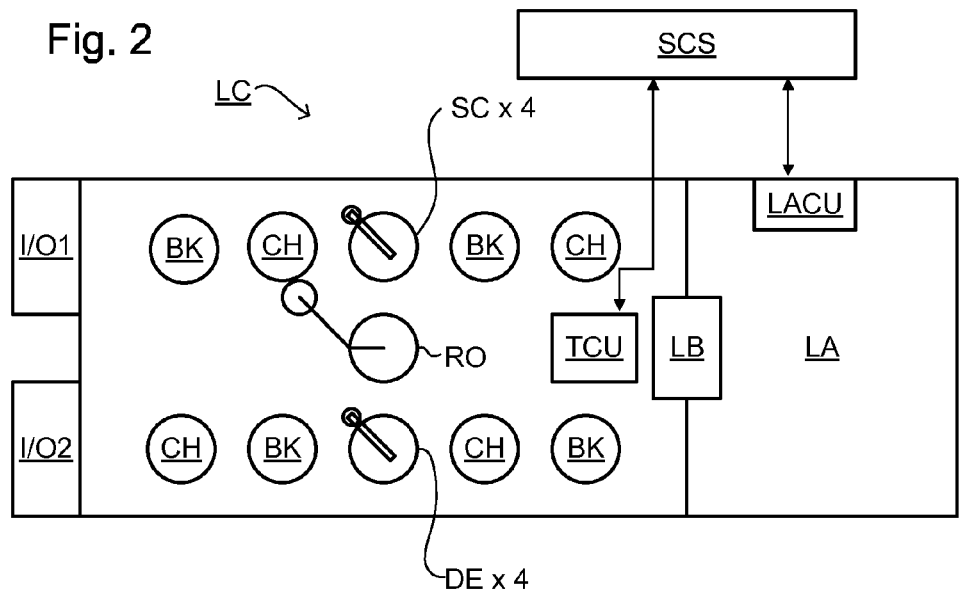
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked, e.g., to improve yield, or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast, such that there is only a very small difference in refractive index between the parts of the resist which have been exposed to radiation and those which have not, and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

FIG. 3 depicts a scatterometer which may be used in an embodiment of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), for example, preferably at least about 0.9, and more preferably at least about 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. In one example, the detector is a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength, or narrow wavelength range, the intensity separately at multiple wavelengths or integrated over a wavelength range. Furthermore, the detector may separately measure the intensity of transverse magnetic and transverse electric polarized light and/or the phase difference between the transverse magnetic and transverse electric polarized light.

Using a broadband light source (i.e., one with a wide range of light frequencies or wavelengths, and therefore of colors) is possible, which gives a large etendue, allowing the mixing of multiple wavelengths. The plurality of wavelengths in the broadband each has a bandwidth of $\lambda 8$ and a spacing of at least $2\lambda 8$ (i.e., twice the bandwidth). A plurality of "sources" of radiation may be different portions of an extended radiation source which have been split using fiber bundles. In this way, angle resolved scatter spectra can be measured at multiple wavelengths in parallel. A 3-D spectrum, for example, such as wavelength and two different angles, can be measured, which contains more information than a 2-D spectrum. This allows more information to be measured which increases metrology process robustness. This is described in more detail in European Patent No. 1,628,164A, which is incorporated by reference herein in its entirety.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

The present invention relates to embodiments of a pattern for use on a mask in an exposure apparatus. The mask of the exposure apparatus may be a transmissive mask, or it may be a reflective mask such as a plurality of individually controllable elements such as mirrors. This mask is used by the exposure apparatus, for example, such as in a lithographic apparatus, to print a marker on a substrate. The marker, or printed pattern, on the substrate is then measured using an inspection apparatus such as a scatterometer or an ellipsometer. Any sort of inspection apparatus may be used as long as it is an inspection apparatus that is capable of measuring radiation that is reflected from a printed structure such as a grating and that may measure parameters of the pattern such as critical dimension (CD) of individual structures within the printed pattern; or sidewall angle (SWA) of the same structures.

The properties of the reflected radiation or the measurements of the marker on the substrate are compared with mathematical models or libraries of previous measurements or simulations and extrapolations of the relationship between these properties (of the reflected radiation or CD or SWA) and focus and/or dose related properties of the exposure apparatus used to print the marker. The focus and/or dose related properties may be focus offset (which may be caused by misalignment of lenses, for instance) or dose offset (caused by fluctuations in the intensity of the radiation beam, for instance). They may also be other focus related parameters like astigmatism, contrast or lens aberrations (typically expressed in zernikes). Alternatively, they may be illumination (i.e., radiation) parameters such as dose or intensity variation. Yet alternatively, the measured properties may be parameters that have an impact on the resist that is similar to the impact caused by dose, such as local bakeplate temperature (which gives rise to similar variations over a substrate surface in reflected radiation or CD or SWA as variations in dose over the substrate surface do) and resist variation (again, variation in resist thickness or density, etc., will give rise to variations in CD and SWA, etc., in a similar way to variations in dose).

An example of a situation in which only offsets in dose (and not necessarily focus) can be measured is as follows. A substrate, once it has been exposed, may be put on a bakeplate, which is a heated plate that dries the resist layer that is on the substrate in order to fix the pattern that has been exposed on it. The heat of the bakeplate on the bottom surface of the substrate has similar properties to intensity of radiation on the top surface of the substrate. If the temperature of the bakeplate is not homogeneous, the resist will not dry uniformly. Measurement of features on the resist (e.g., in a plurality of markers on the substrate) may be measured using the system described above in the same way as measurements are made of dose. Any variations in "dose" that are determined may in fact be variations in temperature of the bakeplate and the bakeplate may be adjusted accordingly to correct for the variations. Indeed, the same markers in the pattern fields of a substrate may be used first to measure dose variations that exist in the exposure tool, and then variations that exist in the bakeplate, taking the dose variations in the exposure tool into consideration for the later measurements. The markers in this case need only be dose sensitive.

Figure 5:
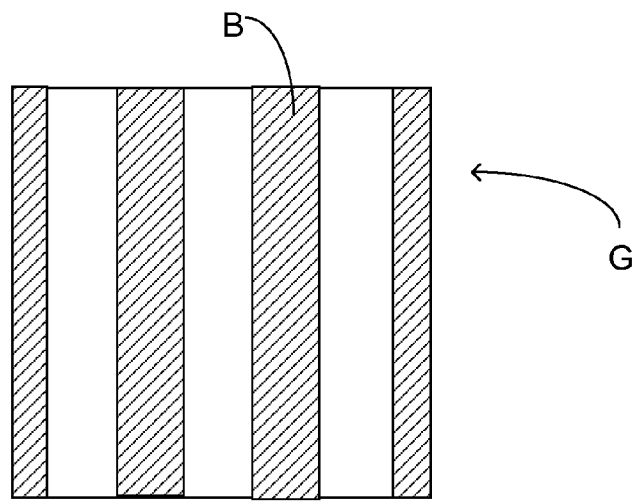
FIG. 5 depicts a focus and dose measurement pattern according to the state of the art according to an embodiment of the invention.

FIG. 5 shows a grating G that includes an array in one dimension of bars B (note that it is the array that is in one dimension, rather than that the bars are one-dimensional). This is an example of a pattern that is commonly used in measuring characteristics such as overlay and alignment of substrates W in lithographic apparatuses. However, as mentioned above, when radiation is reflected from this grating G and parameters such as critical dimension and sidewall angle are determined from the reflected radiation, there can be several combinations of focus and dose that will give rise to the CD and SWA measurements that have been made.

Figure 6A:
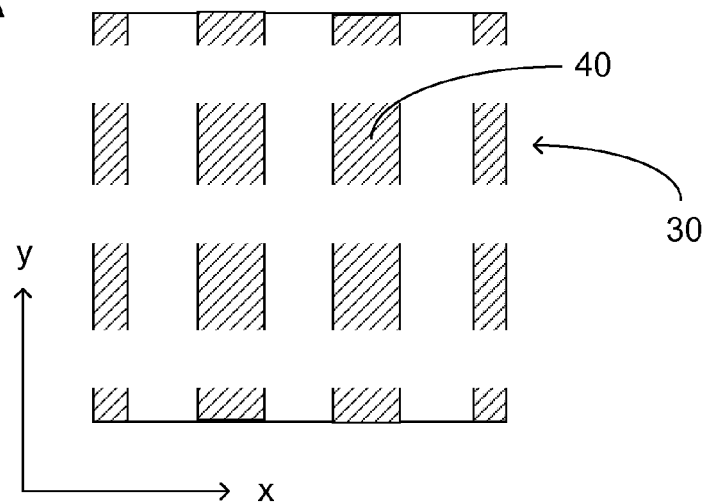
FIGS. 6A and 6B depict focus and dose measurement patterns according to an embodiment of the present invention.

One embodiment of the present invention comprises the creation of a pattern 30 such as that shown in FIG. 6A. The pattern 30 is now a two-dimensional array of structures 40. A feature of the present embodiment is that the two-dimensional repeating structures 40 have different physical or geometric properties in each of the x and y directions. Because of the different physical or geometric properties in each of the x and y directions, each of the orientations has a significant and intentionally different response to focus and dose variations. This results in a more complex overall behavior of the printed structure than mere critical dimension and sidewall angle. As a result, the overall response is unique for a given focus and dose, which enables better separation of focus and dose when compared with measurements of a single one-dimensional array. Combinations of different properties in a single repeating structure according to an embodiment of the invention enables a single marker to be used and means that measurements can be made on a single marker, thus reducing space used on the mask for the pattern, for example, when compared with using a plurality of markers each containing a one-dimensional array or a single structure, and space used on the substrate for the exposed marker, as well as reducing time taken to take the measurements while increasing the reduction in ambiguity of the measurement results.

Figure 6B:
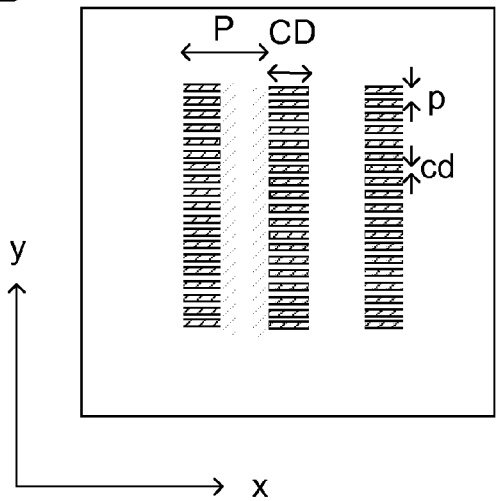

FIG. 6B shows an alternative form of pattern, which may be referred to as a Zebra pattern because of its striped configuration. As can be seen in FIG. 6B, the Zebra pattern has a coarse pitch P in a first direction and a fine pitch p in the orthogonal direction. The coarse pitch P is part of the duty cycle of the Zebra striped pattern, which is varied for optimization based on the focus/dose sensitivity of various illumination modes, i.e., depending on the polarization, wavelength, intensity, etc., of the radiation beam used to irradiate the pattern on the mask to produce the desired testing marker on the substrate. The coarse pitch may be varied between about 400 to about 600 nm, for instance.

Additionally, or alternately, the fine pitch p is not varied because can be fixed at a size smaller than can be printed by the exposure apparatus. For example, the fine pitch may be fixed at approximately 70 nm. The reason that a small pitch is not printed onto the substrate by the exposure apparatus is linked to the wavelength of the exposure radiation used. In the present example, the fine pitch is approximately 70 nm because the resolution of a known lithographic apparatus is about 80 nm, and the fine pitch can be sub-resolution. However, a lithographic apparatus that uses EUV radiation is envisaged by the embodiments of present invention, which has a much smaller resolution such that the fine pitch may be about 50 nm, 30 nm or even 10 nm.

The structures that are not printed onto the substrate (e.g., because they are not resolvable by the exposure apparatus) nevertheless affect the way in which other structures that are printable are printed, in a similar way to the way assist features work. However, the present patterns are designed to respond particularly to focus and dose.

FIG. 6B also shows a coarse critical dimension CD in the same direction as the coarse pitch P, and fine critical dimension CD in the orthogonal direction. Either of these measurements is variable according to illumination modes. The coarse critical dimension CD may be varied between about 200 and 300 nm, for instance, and the fine critical dimension cd may be of the order of about 30-40 nm, with the pitch measurements given above.

In the examples given above for FIG. 6B, the total Zebra pattern may be of the order of about 40 by 40 μm.

The pattern is designed to be of high sensitivity to focus and dose and to be in a small process window. The product area, on the other hand, within the same mask and therefore on the same field of the substrate that is printed using the same mask, is at as low a dose and focus sensitivity as possible and incorporates a large process window. In this way, the product and test patterns do not affect each other, and the product has the more important area on the mask as on the substrate.

As an alternative to the bar-and-space grating layout of the Zebra pattern, the two-dimensional pattern may be made up of other structures such as contact holes or any other shape that allows one pitch direction to be unprintable by the exposure apparatus.

Several different pattern structures are possible and will be imagined by this person skilled in the art. Many alternative segmentations may be used, such as segmenting lines and/or spaces in either or both of the x and y directions, or even incorporating exotic structures like nanocombs. More examples are described below.

Figure 7:
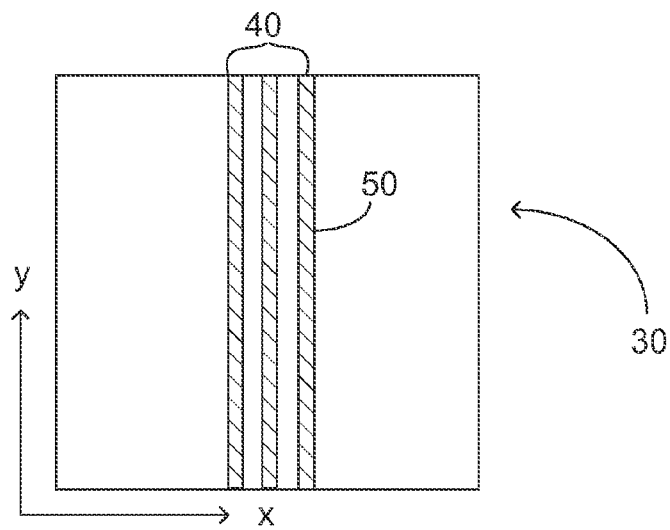
FIG. 7 depicts a focus and dose measurement pattern according to an embodiment of the invention.

Alternatively, a one-dimensional repeating structure may be used as a pattern, starting with a base as shown in FIG. 7. This one-dimensional pattern is effectively the same as the Zebra pattern of FIG. 6B, but the fine pitch p disappears completely to give solid bars 50 as shown in FIG. 7. A pattern 30 with a unit cell or single structure 40 is divided into substructures 50. In one example, there are preferably several substructures per unit cell 40 such that the response of the different substructures of the unit cell to focus and dose may be individually and separately measured. The pattern of FIG. 7 is repeated several times, and represents a unit cell containing substructures that are different in the x and y directions. The bars of FIG. 7 may be divided into different subsegments as shown in, for example, FIG. 12, which is described later.

Figure 8:
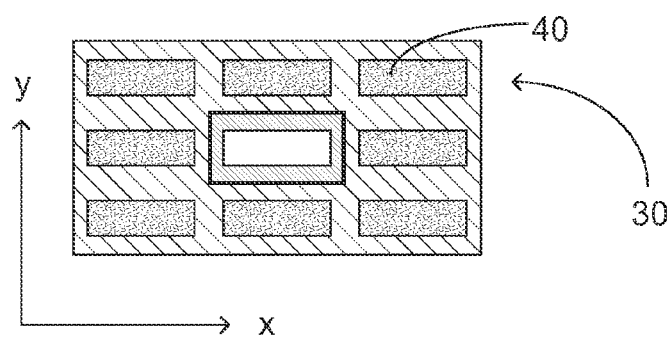
FIG. 8 depicts a focus and dose measurement pattern according to an embodiment of the invention.
Figure 9:
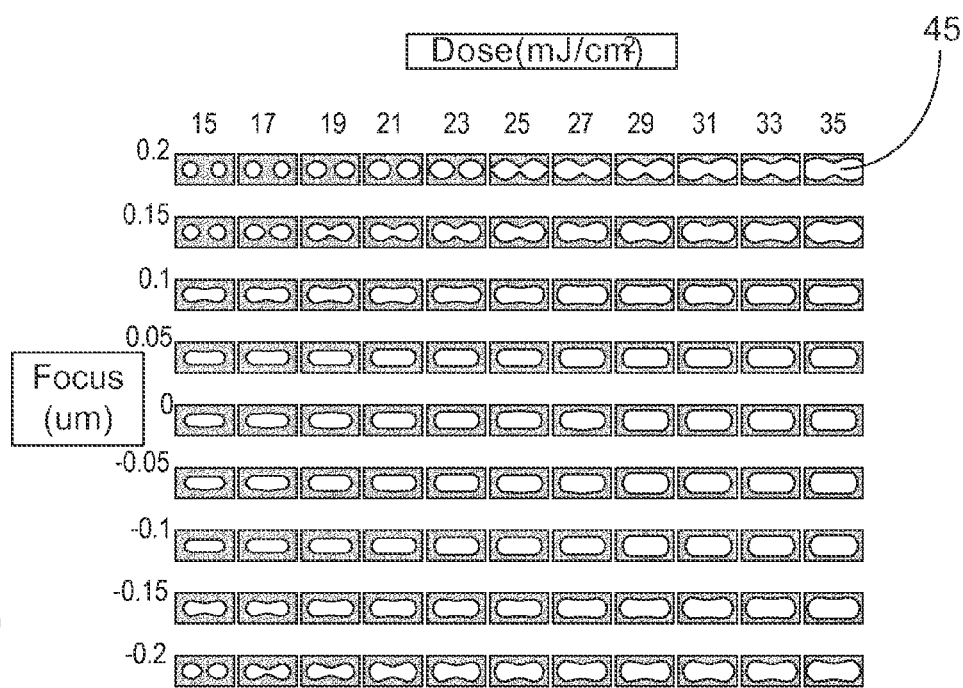
FIG. 9 depicts the relationship between focus and dose for the pattern of FIG. 8, according to an embodiment of the invention.

FIG. 8 shows an alternative pattern 30 with structures 40 that are different in the x and y directions. The response of these structure dimensions to focus and dose variations is shown in FIG. 9. In this example, the line width in the y direction is mainly dependent on dose. In the x direction, the line width is mainly dependent on focus. The various images 45 shown in FIG. 9 are the resulting printed structures on the substrate after exposure, as a function of focus and dose.

In order to determine focus and dose from critical dimension or sidewall angle, a focus dose model is created. The critical dimensions (CD) and sidewall angles (SWA) of a focus energy matrix (FEM) are measured to cover a large range of focus and dose values. From this, a mathematical model is created that describes and interpolates the relationship between focus and dose and CD and SWA. With this interpolated model, any single CD and/or SWA measurement can be converted to focus and dose.

Figure 10A:
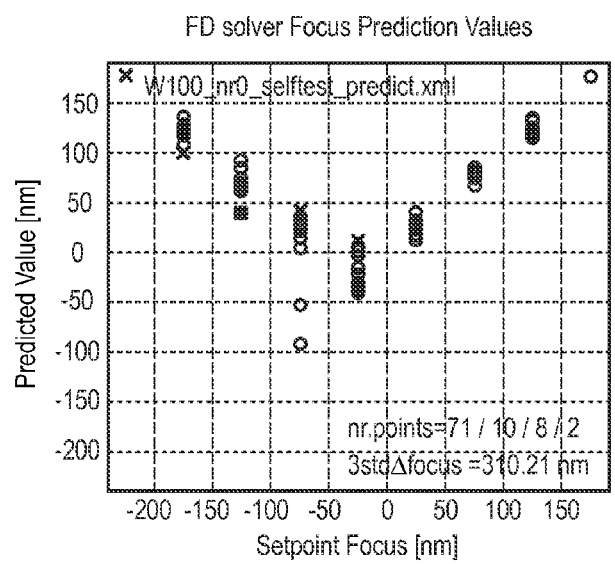
FIG. 10A depicts the behavior of focus measurement according to the state of the art according to an embodiment of the invention.
Figure 10B:
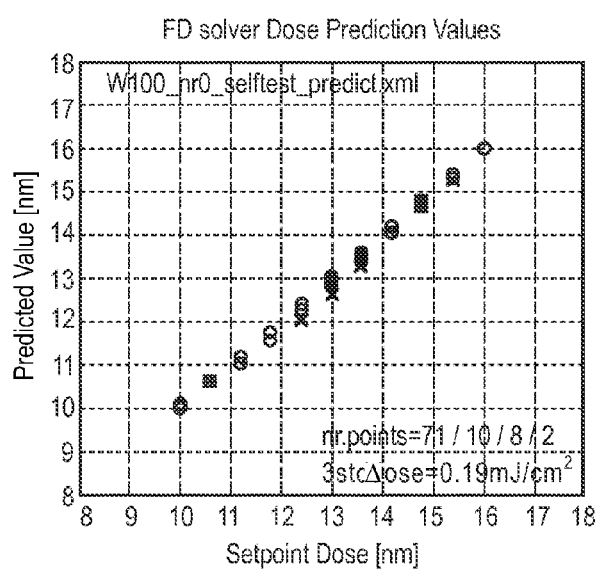
FIG. 10B depicts dose measurement according to the state of the art according to an embodiment of the invention.

A good focus/dose model should be able to predict the focus and dose values for the same measurement target structures that were used to set up the model in the first place. This is tested in a "self test", where set point values and focus and dose are plotted against the predicted values of the target structures as shown in FIGS. 10A and 10B. Ideally, a straight line with a slope 1 is obtained. In other words, the measured model values should be the same as the predicted values. For some one-dimensional structures, however, the focus dose model is unable to determine the correct focus value because of the fact that not enough differences are observed between the printed structure exposed at negative focus values and at positive focus values as shown in FIG. 10A. Negative focus values are where the focal point of the radiation is to one side of the substrate surface; and positive focus values are where the focal point is on the other side of the same substrate surface. Zero would be the substrate surface where focus of the radiation is desired. FIG. 10A shows set focus positions along the bottom axis and predicted values along the vertical axis. As can be seen, the predicted values are almost all positive, which is a problem with classical one-dimensional structures. Dose determination fares slightly better as shown in FIG. 10B, where a straight line with a slope of 1 is possible between set dose and predicted dose.

Figure 11:
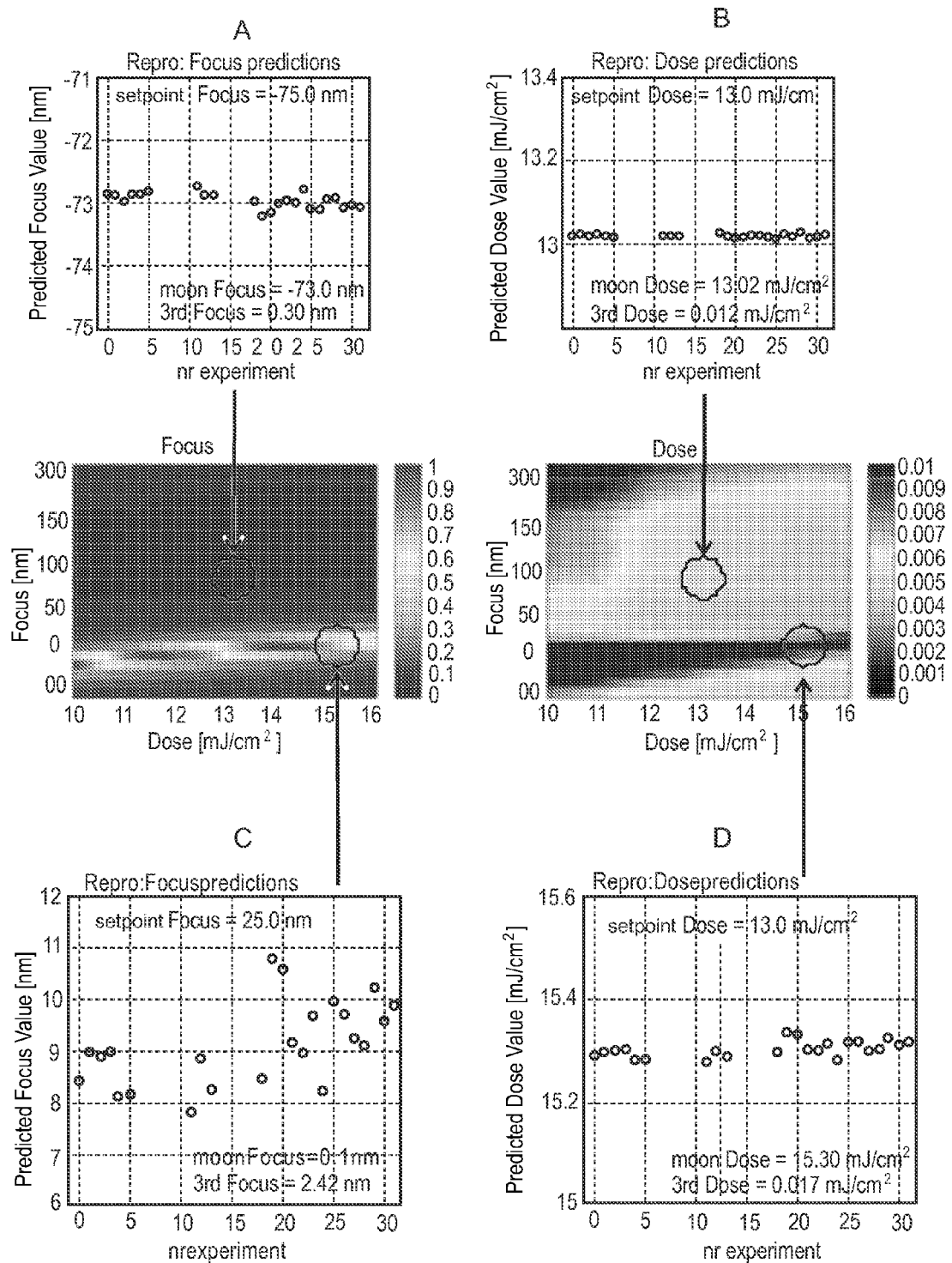
FIG. 11 depicts difficulties of measuring focus and dose according to an embodiment of the invention.

Other issues with non-uniqueness of pattern structure properties result in a large scattering in predicted focus and dose values. This is shown in FIG. 11. Depending on the structures, the location in the focus and dose prediction graphs determine how accurate focus and dose can be determined. Noise estimates show that for certain regions in the graph, focus and dose are more difficult to determine, as shown by the large scattering in graphs C and D corresponding to noisy areas of focus against dose measurement results. In a reproducibility test, the same marker is measured multiple times, after which the focus and dose values are determined. In FIG. 11, it is shown that for the circled area of noise plots that are in the center of the Figure, the lower right hand corner circled area gives rise to higher scattering than for the center circled area of the noise plots.

The advantage of focus and/or dose determination with two-dimensional-repeating structures or one-dimensional-repeating structures with more than one substructure in each unit cell is that the patterns can be designed to be more robust for separating focus and dose information from a single structure in a wider range of radiation conditions and resist and stack properties. This improves the focus-dose measurement potential for resists and for more complex underlying topography. Apart from focus and dose, the additional information from more than two varying properties (i.e., CD and SWA) of the structure can be used to resolve other process or exposure parameters of interest.

Figure 12:
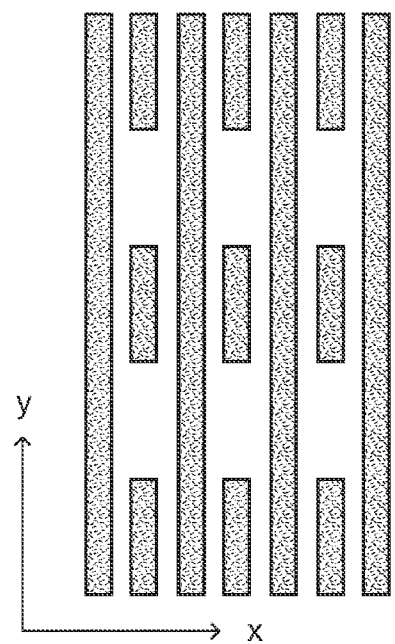
FIG. 12 depicts a pattern with varying substructures according to an embodiment of the invention.

An example of a pattern that contains substructures in alternate lines is shown in FIG. 12. This pattern (which can be present on a mask, for instance, for printing onto the substrate) will print as shown, so that the resultant marker on the substrate will appear the same as the mask's printing pattern. In the x-direction, the marker is dose-sensitive, but not focus-sensitive. This is because the marker generally acts as a regular dense target in the x-direction, which means that variation in focus does not affect it. However, in the y-direction, the marker is both dose- and focus-sensitive because of the larger gap. By using non-conventional (e.g., annular) radiation beam shapes, radiation diffracted because of the marker in the y-direction (during the inspection phase) can be discerned from the diffraction in the x-direction. By filtering appropriately in the pupil plane, focus and dose can thereby be discriminated from each other, for example, by investigating CD measurements of the normal lines and the chopped lines of the marker shown in FIG. 12.

One of the keys of using sub-arrays or substructures within arrays is that this changes the transmissivity of the pattern (or marker) in at least one direction. The reason for this is that the CD of structures is what affects the transmissivity to radiation of the pattern. The CD of the structures may be varied to affect the transmissivity of the pattern, depending on what properties of the exposure apparatus are being measured.

As long as a structure that can be measured as a line is printed onto the substrate, focus measurements can be made. When there is a change in transmissivity, dose properties can be measured. Another example of a pattern that can be used to measure dose and focus (or other related properties) is a checkerboard pattern, with the dark squares (or other shape) being structures (including holes or dots), and the light squares (or other shape) being spaces between the structures. The relative sizes of the structures and spaces may be altered to affect transmissivity, or the structures may vary in size and/or shape from one 1-D or 2-D array to the next. Alternatively, to measure dose and focus/dose, the structures and spaces may be arranged to be printable in one direction but not in the other, as described in relation to FIG. 12 above.

From any such periodic 2-D pattern, both focus and dose may be determined from any of the following methods, which are not meant to limit the scope of the invention nor be an exhaustive list:

1. focus and dose being measured directly from a diffraction spectrum of radiation reflected from the pattern (e.g., by comparing with expected, modeled or simulated diffraction spectra);

2. focus and dose being measured using an overlay measurement, where a marker printed from a pattern such as that described above is printed on consecutive layers on a substrate and the overlay offset of the consecutive layers is measured by investigating the behavior of radiation reflected from the superimposed layers compared with expected behavior;

3. focus and dose being measured using the reconstruction of SWA, CD and other physical properties of structures on the substrate using various direct and indirect measurement techniques; and 4. focus and dose being measured by investigating radiation information at the pupil plane (where diffracted radiation is effectively focused and can be investigated).

The resultant focus and dose related measurements are fed back or fed forward to the exposure apparatus, which then compensates for any error in either measurement.

FIGS. 13 through 17 depict the comparison of simulations that have been carried out comparing standard one-dimensional patterns with standard one-dimensional patterns that include assist features and with two-dimensional patterns as described above. In the specific examples shown, the pitch of all of the patterns was about 380 nm, except for the two-dimensional pattern shown in FIGS. 13C and 15C, which have a (coarse) pitch in the x direction of about 380 nm but a (fine) pitch in the y direction of about 150 nm. In all of the examples, the resist thickness was about 125 nm.

FIG. 13A shows a pattern with a single structure in the shape of a bar. A comparison of measured critical dimension (shown as mean critical direction MCD in the figures) is compared with dose. As can be seen from the graph of FIG. 13A, the slopes are not very steep, which means that the sensitivity of CD to dose is low. Each of the lines in the graph relates to different focus values (in μm).

FIG. 13B depicts a pattern with assist features. By assist features, it is meant that further structures are included in the pattern on the mask in order to compensate for edge of structure errors and blurring that can appear on printed patterns. The structures 55 are the assist features to the main structure 40 as shown in FIG. 13B. Although these assist features 55 appear on the mask pattern, they do not appear in the printed structure on a substrate because they are too small to be distinguished by the wavelength used and/or fully compensated for in canceling out any edge errors of the main structure 40. As can be seen on the graph in FIG. 13B, the assist features cause the slope of the CD against dose to be steeper than without the assist features.

FIG. 13C shows a pattern 30 with two-dimensional periodic structures 40 according to an embodiment of the present invention. As can be seen from the graph, for any fixed value of focus, the slope of CD against dose is steeper on average even than the graph for the pattern with the assist features. This means that the (CD of the) 2D pattern is more sensitive to dose than other patterns tested.

FIG. 14 compares the slopes of each of the patterns of FIG. 13 with a focus value. The larger the overall absolute values of the slopes (or the more negative these values), the more sensitive the pattern, which can be described alternatively as the less space under the graph, the more sensitive the pattern used. The two-dimensional target achieves this more than the pattern either with or without assist features.

FIG. 15 illustrate the same measurements as FIG. 13, but for sidewall angle compared with focus measurements. As with FIG. 13, FIG. 15A depicts a mask pattern with a single structure 40. The graph of SWA against focus is also shown in the same figure. FIG. 15B shows a graph of SWA against focus for a pattern with a main structure 40 and assist features 55. Finally, FIG. 15C shows a graph for SWA against focus for a two-dimensional pattern 30 with structures 40 that are different in the x and y directions. The two-dimensional pattern results in a steeper average slope of SWA against focus than either of the other two patterns. FIG. 16 shows the slope from the graphs of FIGS. 15A, 15B and 15C against measured dose. The graph of FIG. 16 shows that the slope against dose is steeper for the two-dimensional pattern than for the other two patterns.

FIG. 17 shows a table of dose sensitivity and focus sensitivity for each of the three patterns shown in FIGS. 13 and 15. As can be seen from the table, dose and focus sensitivity increases from the pattern with no assist features to the pattern with assist features and again to the pattern with a two-dimensional structure array. These results are for a dose between 12.5 and 13.5 mJ/cm2 and focus of −0.100 to −0.050 μm.

The two-dimensional patterns therefore have been shown in tests to be more sensitive to dose and focus than other types of known patterns.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional storing blocks illustrating the implementation of specified functions and relationships thereof. The boundaries of these functional storing blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
   printing a marker on a substrate using an exposure apparatus and a mask, the mask including a pattern for creating the marker, wherein the marker comprises a two-dimensional array of structures formed by repeated exposure of the pattern, such that the structures along an x direction of the two-dimensional array are sensitive to dose variations, but are not sensitive to focus variations, and the structures along a y direction of the two-dimensional array are sensitive to both dose and focus variations; and
   measuring a property of the substrate that has been exposed by the exposure apparatus and the mask, the measuring comprising:
      projecting a radiation beam onto the marker on the substrate;
      detecting radiation reflected from the marker on the substrate; and
      determining, from the properties of the reflected radiation, at least one of the focus and the dose of the exposure apparatus.

2. The method according to claim 1, wherein a result of at least one of the focus and the dose related measurements of the exposure apparatus being measured is fed back to the exposure apparatus for correction of any errors in at least one of the focus and the dose related properties.

3. The method according to claim 1, further comprising:
   printing the marker on the substrate using at least one of focus and dose offsets;
   measuring a variation of properties of the reflected radiation as a function of the at least one of focus and dose offsets; and
   storing a library of relationships between properties of the reflected radiation and at least one of focus and dose offsets based on the measurement of the variation of the properties.

4. The method according to claim 1, further comprising:
   simulating at least one of the marker pattern and the reflected radiation in response to various offsets of at least one of focus and dose of the exposure apparatus; and
   storing a mathematical model of the at least one of the marker pattern and the reflected radiation characteristics for various focus and dose offsets based on the simulations.

5. The method of claim 1, wherein the projecting a radiation beam comprises projecting a radiation beam having an annular shape, such that diffraction of the radiation beam due to the marker in the y-direction is discernable from diffraction of the radiation beam due to the marker in the x-direction.

6. An inspection apparatus configured to measure a property of a substrate on which a marker has been printed by an exposure apparatus using a mask containing a pattern comprising a two-dimensional array of structures arranged such that the marker includes repeating structures formed by repeated exposure of the pattern, such that the structures along an x direction of the two-dimensional array are sensitive to dose variations, but are not sensitive to focus variations, and the structures along a y direction of the two-dimensional array are sensitive to both dose and focus variations, the inspection apparatus comprising:
   a radiation source;
   a projection system configured to direct radiation from the radiation source onto the marker;
   a detector configured to detect radiation reflected from the marker; and
   a processor configured to determine properties of the reflected radiation and, from the properties of the reflected radiation, determine at least one of focus and dose related properties of the exposure apparatus used to print the marker.

7. The inspection apparatus according to claim 6, wherein the processor is configured to determine the at least one of focus and dose related properties of the exposure apparatus by comparing the reflected radiation with a library of at least one of previously measured, simulated and extrapolated relationships between properties of the reflected radiation and the at least one of focus and dose related properties.

8. The inspection apparatus of claim 6, wherein the radiation directed onto the marker has an annular shape, such that diffraction of the radiation due to the marker in the y-direction is discernable from diffraction of the radiation due to the marker in the x-direction.

9. A lithographic cell comprising:
a coater arranged to coat a substrate with a radiation sensitive layer;
an exposure apparatus configured to expose an image onto the radiation sensitive layer of the substrate coated by the coater;
a developer configured to develop the image exposed by the exposure apparatus; and
an inspection apparatus configured to measure a property of a substrate on which a marker has been printed by the exposure apparatus using a mask containing a pattern, the pattern comprising a two-dimensional array of structures arranged such that the marker includes repeating structures formed by repeated exposure of the pattern, such that the structures along an x direction of the two-dimensional array are sensitive to dose variations, but are not sensitive to focus variations, and the structures along a y direction of the two-dimensional array are sensitive to both dose and focus variations, the inspection apparatus comprising,
a radiation source,
a projection system configured to direct radiation from the radiation source onto the marker,
a detector configured to detect radiation reflected from the marker, and
a processor configured to determine properties of the reflected radiation and, from the properties of the reflected radiation, determine at least one of focus and dose related properties of the exposure apparatus used to print the marker.

10. The lithographic cell according to claim 9, wherein the processor is configured to determine the at least one of focus and dose related properties of the exposure apparatus by comparing the reflected radiation with a library of at least one of previously measured, simulated and extrapolated relationships between properties of the reflected radiation and the at least one of focus and dose related properties.

11. The lithographic cell of claim 9, wherein the radiation directed onto the marker has an annular shape, such that diffraction of the radiation due to the marker in the y-direction is discernable from diffraction of the radiation due to the marker in the x-direction.

* * * * *